United States Patent
Miyadera et al.

(10) Patent No.: US 10,329,659 B2
(45) Date of Patent: Jun. 25, 2019

(54) METHOD FOR LASER DEPOSITION OF ORGANIC MATERIAL FILM OR ORGANIC-INORGANIC COMPOSITE MATERIAL FILM, AND LASER DEPOSITION APPARATUS

(71) Applicant: NATIONAL INSTITUTE OF ADVANCED INDUSTRIAL SCIENCE AND TECHNOLOGY, Tokyo (JP)

(72) Inventors: Tetsuhiko Miyadera, Tsukuba (JP); Takeshi Sugita, Tsukuba (JP); Takurou Murakami, Tsukuba (JP); Masayuki Chikamatsu, Tsukuba (JP); Koji Matsubara, Tsukuba (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 53 days.

(21) Appl. No.: 15/505,965

(22) PCT Filed: Aug. 21, 2015

(86) PCT No.: PCT/JP2015/073596
§ 371 (c)(1),
(2) Date: Jun. 5, 2017

(87) PCT Pub. No.: WO2016/031727
PCT Pub. Date: Mar. 3, 2016

(65) Prior Publication Data
US 2017/0268094 A1 Sep. 21, 2017

(30) Foreign Application Priority Data
Aug. 29, 2014 (JP) .................. 2014-175492

(51) Int. Cl.
*C23C 14/12* (2006.01)
*C23C 14/28* (2006.01)
(Continued)

(52) U.S. Cl.
CPC .............. *C23C 14/12* (2013.01); *C23C 14/28* (2013.01); *H01G 9/2009* (2013.01);
(Continued)

(58) Field of Classification Search
CPC ................................ C23C 14/12; C23C 14/28
See application file for complete search history.

(56) References Cited

U.S. PATENT DOCUMENTS

| 2001/0008121 | A1 | 7/2001 | Tanabe et al. |
| 2003/0121887 | A1* | 7/2003 | Garvey ................ B82Y 30/00 216/65 |
| 2009/0308316 | A1 | 12/2009 | Park |

FOREIGN PATENT DOCUMENTS

| JP | 2000-012218 A | 1/2000 |
| JP | 2005-212013 A | 8/2005 |

(Continued)

OTHER PUBLICATIONS

Era, Chem. Mater. 1997, V9, p. 8-10. (Year: 1997).*
(Continued)

*Primary Examiner* — Joseph A Miller, Jr.
(74) *Attorney, Agent, or Firm* — Sughrue Mion, PLLC

(57) ABSTRACT

A method of laser-depositing at least one type of organic material, characterized in that a duty ratio of a laser that evaporates the organic material is adjusted, which addresses the problem of providing an organic material deposition method and deposition apparatus that solve the issues in the conventional art, such as the organic material vaporizing and contaminating the other raw materials to be deposited, and the film formation rate running out of control, and whereby (Continued)

the film formation rate and the evaporation rate can be stably adjusted and controlled. Additionally, the invention is characterized in that the duty ratio is adjusted based on the evaporation rate of the organic substance or the vapor pressure inside the vacuum chamber used for deposition.

6 Claims, 3 Drawing Sheets

(51) Int. Cl.
    *H01G 9/20*     (2006.01)
    *H01L 51/00*     (2006.01)
    *H01L 51/42*     (2006.01)

(52) U.S. Cl.
    CPC ........ *H01L 51/001* (2013.01); *H01L 51/0009* (2013.01); *H01L 51/422* (2013.01)

(56) References Cited

FOREIGN PATENT DOCUMENTS

| | | |
|---|---|---|
| JP | 2008-244040 A | 10/2008 |
| JP | 2009-299176 A | 12/2009 |
| JP | 2014-082377 A | 5/2014 |
| WO | 2007/029743 A1 | 3/2007 |
| WO | 2008/117690 A1 | 10/2008 |
| WO | WO2014022635   * | 2/2014 |

OTHER PUBLICATIONS

Mingzhen Liu, et al., "Efficient planar heterojunction perovskite solar cells by vapour deposition", Nature, Sep. 19, 2013, pp. 395-398, vol. 501.

Masanao Era, et al., "Preparation of Layered Perovskite Self-Organized Quantum Well by Dual Source Vapor Deposition", Journal of the Vacuum Society of Japan, 1996, pp. 598-602, vol. 39, No. 11.

Tamiko Oshima, "Development of Full-color Organic Electroluminescence devices by Pulsed Laser Deposition Method in Atmosphere", Nippon Sheet Glass Foundation for Materials Science and Engineering Report, 2007, pp. 52-57, vol. 25.

Tetsuhiko Miyadera, et al., "Fabrication of Organolead-Halide-Perovskite Solar Cells by Laser Deposition", The 75th JSAP Autumn Meeting Koen Yokoshu, Sep. 1, 2014, 19p-A1-10, p. 12-376.

International Search Report for PCT/JP2015/073596 dated Oct. 27, 2015 [PCT/ISA/210].

* cited by examiner

METHOD FOR LASER DEPOSITION OF ORGANIC MATERIAL FILM OR ORGANIC-INORGANIC COMPOSITE MATERIAL FILM, AND LASER DEPOSITION APPARATUS

CROSS REFERENCE TO RELATED APPLICATIONS

This application is a National Stage of International Application No. PCT/JP2015/073596, filed on Aug. 21, 2015, which claims priority from Japanese Patent Application No. 2014-175492, filed on Aug. 29, 2014, the contents of all of which are incorporated herein by reference in their entirety.

TECHNICAL FIELD

The present invention relates to a laser deposition method and a laser deposition apparatus that are useful when forming a film containing an organic material, such as an organolead perovskite ($APbX_3$, where A is an organic cation and X is a halogen), by laser deposition.

BACKGROUND ART

Due to rapid improvements in the efficiency of solar cells using organolead perovskites ($APbX_3$), organolead perovskites have been the focus of much attention and many diverse production methods have been reported. Among these, Non-patent Document 1 describes that an organolead perovskite was produced by heater-heated codeposition, and that a high solar cell efficiency was obtained by the resulting organolead perovskite. Additionally, Patent Document 1 and Non-patent Document 2 describe that an organic-inorganic composite perovskite containing an organolead perovskite was formed by codeposition.

In order to form organolead perovskite by codeposition, an organic material (AX) and a lead halide ($PbX_2$) must be simultaneously or alternately evaporated.

However, many of the organic materials (AX) that are used in such codeposition are materials having high vapor pressures, so there are problems in that the organic materials can vaporize in the vacuum chamber and greatly degrade the vacuum level, the vaporized material may spread and contaminate the other raw materials that are to be deposited and the like, and the film deposition rate may run out of control. These problems have a significant impact, not only on the film formation process, but also on the film quality of the formed thin-film.

For this reason, the precedent literature, such as Non-patent Document 1, describes that the film formation of an organolead perovskite having a certain level of film quality was possible, but it can be assumed that there were considerable difficulties in finding stable codeposition conditions and that long-term stable codeposition was mostly impossible, and it can also be assumed that there is much room for improvement in the film quality of the formed thin films.

RELATED LITERATURE

Patent Documents

[Patent Document 1]
JP 2014-82377 A

Non-Patent Documents

[Non-Patent Document 1]
LIU, Mingzhen, JOHNSTON, Michael B. and SNAITH, Henry J., *Nature* 501, 395 (2013)

[Non-Patent Document 2]
ERA, Masanao, TAIRA, Takahiro, TSUTSUI, Tetsuo, *Shinku*, Vol. 39, No. 11, p. 598 (1996)

SUMMARY OF INVENTION

Technical Problem

The present invention was made against the background of the above-mentioned conventional art, and addresses, as a first problem, that of providing an organic material deposition method and deposition apparatus that solve the issues in the conventional art, such as the organic material vaporizing and contaminating the other raw materials to be deposited, and the film formation rate running out of control, and whereby the film formation rate and the evaporation rate can be stably adjusted and controlled.

Additionally, the present invention addresses the second and additional problem of providing a laser deposition method that, by stably adjusting and controlling the film formation rate and the evaporation rate, can form a film of a high-quality organic-inorganic composite by codeposition.

Solution to Problem

The present inventors conducted extensive testing and research regarding the deposition of organic materials, and during the research process thereof, made the following discoveries (A) and (B).

(A) By employing a laser as the evaporation means for the organic material and adjusting the duty ratio of the laser, the vaporization of the organic material can be restricted, the contamination of other raw materials to be deposited and the like due to the spread of the vaporized organic material can be prevented, and the directionality of the deposition flux and the film formation rate can be easily controlled. For this reason, when applied to the codeposition of an organolead perovskite or the like, a good film quality can be obtained in the formed thin film.

(B) By adjusting the duty ratio of the laser on the basis of measurement results of the evaporation rate of the organic material or the vapor pressure inside the vacuum chamber, the film formation rate and the evaporation rate can be favorably adjusted and controlled.

The present invention was completed on the basis of the above-mentioned discoveries, and the present application provides the following invention.

<1> A laser deposition method of laser-depositing at least one type of organic material, characterized by adjusting a duty ratio of a laser that evaporates the organic material.

<2> The laser deposition method according to claim 1, wherein an organic-inorganic composite is codeposited by evaporating the organic material using the laser having an adjusted duty ratio, and evaporating an inorganic material using a laser.

<3> The laser deposition method according to <2>, wherein an organic-inorganic composite perovskite is codeposited by using a halide of an organic cation as the organic material; and using $MX_2$, where M is a divalent metal ion and X is at least one halogen selected from the group consisting of F, Cl, Br and I, as the inorganic material.

<4> The laser deposition method according to any one of <1> to <3>, characterized in that the duty ratio is adjusted based on an evaporation rate of the organic material.

<5> The laser deposition method according to any one of claims <1> to <3>, characterized in that the duty ratio is adjusted based on a vapor pressure inside a vacuum chamber used for deposition.
<6> A laser deposition apparatus that is used when laser-depositing at least one type of organic material, comprising evaporation rate measuring means for the organic material, and duty ratio adjusting means for adjusting a duty ratio of a laser that evaporates the organic material, based on an evaporation rate measured by the evaporation rate measuring means.
<7> A laser deposition apparatus that is used when laser-depositing at least one type of organic material, comprising vapor pressure measuring means for measuring a vapor pressure inside a vacuum chamber used for deposition, and duty ratio adjusting means for adjusting a duty ratio of a laser that evaporates the organic material, based on the vapor pressure measured by the vapor pressure measuring means.

The present invention may include the following embodiments.
<8> The laser deposition method according to <3>, wherein the codeposited organic-inorganic composite perovskite is represented by formula (1) or formula (2):

$$AMX_3 \qquad (1)$$

$$B_2MX_4 \qquad (2)$$

where A and B represent organic cations, M represents a divalent metal ion, and X represents a halogen.
<9> The laser deposition method according to <8>, wherein A is $CH_3NH_3^+$, B is $R^1NH_3^+$, where $R^1$ has two or more carbon atoms and is an alkyl group, an alkenyl group, an aralkyl group or an aryl group, and M is Pb, Sn or Ge.
<10> The laser deposition method according to <4>, characterized in that the duty ratio is adjusted so that the evaporation rate has a constant value or is a value within a predetermined range.
<11> The laser deposition method according to <5>, characterized in that the duty ratio is adjusted so that the vapor pressure has a constant value or is a value within a predetermined range.
<12> The laser deposition apparatus according to <6>, wherein the duty ratio adjusting means adjusts the duty ratio so that the evaporation rate has a constant value or is a value within a predetermined range
<13> The laser deposition apparatus according to <7>, wherein the duty ratio adjusting means adjusts the duty ratio so that the vapor pressure has a constant value or is a value within a predetermined range Advantageous Effects of Invention According to the laser deposition method and laser deposition apparatus of the present invention, it is possible to reduce the vaporization of organic materials having high vapor pressures and to carry out deposition while maintaining an appropriate vacuum level (e.g., on the order of $10^{-3}$ Pa).

In conventional methods wherein cells are heated by a heater for evaporation, there were problems in that the vaporization of organic materials significantly degrades the vacuum level inside the vacuum chamber (to about 1 Pa), and vaporized materials can spread and contaminate the other deposition raw materials and the like. However, according to the present invention, the vaporization does not occur or is sufficiently reduced so that contamination due to the spread of the vaporized material can be prevented, and the directionality of the evaporation flux and the film formation rate can be controlled. For this reason, good quality can be obtained in the case of application to film formation of organic-inorganic composite perovskites or the like.

In conventional methods, the organic material was evaporated by using a heater to heat and raise the temperature of the entire cell, so it was difficult to form films by stably adjusting and controlling the evaporation rates of organic materials having a high vapor pressure, such as perovskite raw materials, even when the heating temperature was controlled. However, according to the present invention, the energy necessary for evaporation is directly imparted to the organic material by laser irradiation with an adjusted duty ratio. Thus, it is possible to form the films by stably adjusting and controlling the evaporation rate of the organic material.

DESCRIPTION OF EMBODIMENTS

Figure 1:
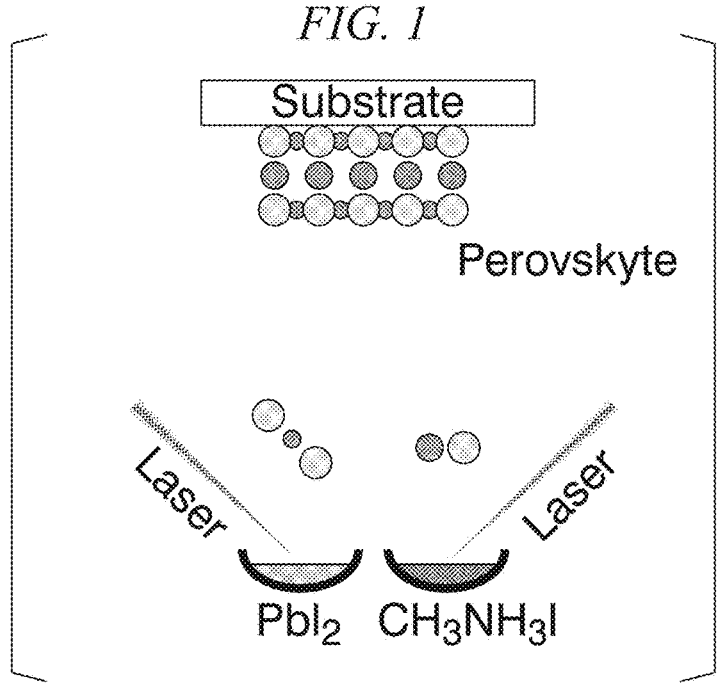
FIG. 1 is a diagram schematically illustrating the formation of an organolead perovskite film by laser codeposition.

FIG. 1 schematically illustrates an example of film formation of an organolead perovskite by laser codeposition. An organic material AX (where A is an organic cation, and X is at least one halogen selected from the group consisting of F, Cl, Br and I) and an inorganic material $PbX_2$ (where X is the same halogen as above) to be deposited are respectively irradiated with lasers, and the respective deposition fluxes (vapors of the film formation materials) form an organolead perovskite ($APbX_2$) codeposition film on a substrate.

The laser deposition method of the present invention involves laser deposition of at least one type of organic material, and is characterized by adjusting the duty ratio (ON time/(ON time+OFF time) or pulse width/pulse period) of the laser used to evaporate the organic material.

In the example in FIG. 1, a plurality of materials are evaporated and codeposited, but the present invention is not limited to such codeposition, and any method is included in the present invention as long as it involves laser-depositing at least one type of organic material and adjusting the duty ratio of the laser.

The organic material used in the present invention is not limited, but examples include halogenated alkylamines such as iodinated methylamine and iodinated ethylamine, aralkylamine halides such as phenylethylamine iodides, and halogenated formamines such as iodinated formamine.

Such low-molecular-weight (molecular weights of about 200 or less, though not limited thereto) organic materials generally have a high vapor pressure compared to inorganic materials such as metals and oxides. Thus, in conventional vacuum deposition methods using heater-heated temperature control, there were problems in that vaporization could occur in the vacuum chamber and greatly degrade the vacuum level, or the film formation rate could run out of control. However, in the present invention, the organic material is laser-deposited and the duty ratio of the laser is adjusted. Therefore, vaporization such as that mentioned above can be greatly reduced, and the directionality of the deposition flux and the film formation rate can be controlled.

In the laser deposition of the present invention, any publicly known type of laser can be used for evaporating the organic material, as long as the duty ratio can be adjusted. However, a laser for which the amplitude (laser output) of the laser pulse can be adjusted is preferable. While the type of laser is not limited, examples include KrF excimer lasers (wavelength 248 nm). Nd:YAG lasers (wavelength 355 nm) and infrared lasers (wavelength 808 nm, 850 nm, 980 nm, etc.). For the organic material, an infrared laser is preferably used.

Although the frequency of the laser pulse is not limited, it may, for example, be 1-500 Hz.

The duty ratio may be adjusted by means of publicly known means such as adjustment of the pulse width.

With the laser deposition method of the present invention, the duty ratio may be adjusted to a predetermined value or within a predetermined numerical range in accordance with the type of organic material used and the laser pulse amplitude. However, by observing the evaporation rate of the organic material or the vapor pressure inside the vacuum chamber used for deposition and adjusting the duty cycle based on the observed values, it is possible to stably control the evaporation rate and the film formation rate without requiring much consideration of the type of organic material or the like.

As the means for observing the evaporation rate of the organic material, it is possible to use, for example, a crystal oscillator film thickness meter that is provided near the path of the evaporation flux and that measures the film thickness of the deposition film, and a means for taking the time derivative of the deposition film thickness evolution obtained by the film thickness meter, though the invention is not limited to such an embodiment. While it is preferable to provide a film thickness meter such as a crystal oscillator film thickness meter that corresponds to only the organic material being deposited, it may be shared with the other inorganic material being deposited in the case of codeposition, and may measure the film thickness of the total deposition film of the organic material and the inorganic material. If the laser power used for the inorganic material is constant, the evaporation rate of the inorganic material can be expected to remain approximately constant even if the duty ratio of the laser used for the organic material is adjusted. Therefore, by determining, beforehand, the evaporation rate of the inorganic material when the laser power used for the inorganic material is constant, and measuring the film thickness evolution of the total deposition film of the organic material and the inorganic material under conditions in which the laser power used for the inorganic material is held constant, the evaporation rate of the organic material can be estimated by subtracting the deposition rate of the inorganic material from the total deposition rate of the organic material and the inorganic material obtained by taking the time derivative of the film thickness evolution. The evaporation rate measuring means for the organic material in the present invention includes means for estimating the evaporation rate of the organic material in such a manner.

The vapor pressure measuring means that observes the vapor pressure inside the vacuum chamber being used for deposition can be chosen, as appropriate, from among those that are publicly known While the adjustment of the duty ratio based on observations of the evaporation rate of the organic material or the vapor pressure inside the vacuum chamber used for deposition may be performed manually by an operator, it is preferable to provide an evaporation rate or vapor pressure measuring means, and a duty ratio adjusting means that automatically adjusts the duty ratio based on the measured values thereof.

The target material (the material to be deposited in the laser deposition method) used in the laser deposition method of the present invention may be a single type of organic material, but the laser deposition may involve codeposition using two or more types of organic materials as the target materials, or codeposition using an organic material and an inorganic material as the target materials. In the case of laser deposition in which codeposition is performed using an inorganic material as the target material, it is possible to use a laser for which the duty ratio can be adjusted, as mentioned above, as the laser for depositing the inorganic material. However, it is also possible to use a laser for which the duty cycle cannot be adjusted, e.g., a continuous-wave laser beam, as long as the power is adjustable. In order to achieve good film quality in the formed thin film, it is preferable to use a laser in which the duty ratio can be adjusted, similar to that used for the organic material.

As the inorganic material to be codeposited with the organic material, it is possible to use any publicly known inorganic material that is used for deposition.

The laser deposition method of the present invention, particularly when applied to the production of an organic-inorganic composite perovskite, is capable of effectively adjusting the evaporation rate and film formation rate of organic materials having high vapor pressures, so the method is able to stably produce, for a long time, an organic-inorganic composite perovskite of good quality.

Examples of such organic-inorganic composite perovskites, while not limiting, include those represented by formulas (1) and (2):

$$AMX_3 \qquad (1)$$

$$B_2MX_4 \qquad (2)$$

where A and B represent organic cations, M represents a divalent metal ion, and X represents a halogen.

Examples of the organic cation A include $CH_3NH_3^+$, $CH(NH_2)_2^+$ and the like, and examples of the organic cation B include $R^1NH_3$, where $R^1$ has two or more carbon atoms and is an alkyl group, an alkenyl group, an aralkyl group or an aryl group.

M is a divalent metal ion, such as Pb, Sn or Ge.

X is a halogen and is selected from among F, Cl, Br and I.

Of the target materials when forming a film of an organic-inorganic composite perovskite by laser codeposition in this manner, examples of the organic material constituting A include, but are not limited to, halogenated methylamines such as iodinated methylamine and halogenated formamidylamines such as iodinated formamidylamine. Examples of the organic material constituting B include, but are not limited to, halogenated alkylamines such as iodinated ethylamine, and aralkylamine halides such as phenylethylamine iodides.

Of the target materials that are used when forming a film of an organic-inorganic perovskite by codeposition, examples of the inorganic material constituting M include, but are not limited to, metal halides such as lead iodide.

EXAMPLES

Hereinafter, the present invention will be explained in further detail by referring to examples etc., but the present invention is not to be construed as being limited by these examples etc.

Comparative Example 1

A laser deposition apparatus was set up by installing $PbI_2$ and $CH_3NH_3I$ as targets (to be irradiated by laser beams) inside a vacuum chamber for deposition, so as to irradiate both targets respectively with continuous-wave laser beams having a wavelength of 808 nm.

After setting the vacuum level inside the vacuum chamber to $10^{-5}$ Pa, the power of the $PbI_2$-side laser was raised to 1.6 W, the power of the $CH_3NH_3I$-side laser was raised to 6 W, and organolead perovskite ($CH_3NH_3PbI_3$) was formed by codeposition onto a glass substrate surface. However, vaporization of the $CH_3NH_3I$ during film formation degraded the vacuum level to 1 Pa. After codeposition, the $PbI_2$ target was contaminated to a brown color by the spread of $CH_3NH_3I$. Additionally, the resulting film, in view of XRD analysis and the UV/visible absorption spectrum and the like, could not be considered to be pure organolead perovskite ($CH_3NH_3PbI_3$), and was a mixed material containing large quantities of unreacted raw material.

Comparative Example 2

A film of organolead perovskite ($CH_3NH_3PbI_3$) was formed by codeposition in the same manner as in Comparative Example 1, except that the power of the $CH_3NH_3I$-side laser was lowered to 2 W. The degradation of the vacuum level due to vaporization of $CH_3NH_3I$ during film formation was suppressed to $10^{-2}$ Pa. However, after codeposition, the $PbI_2$ target was contaminated to a brown color by the spread of $CH_3NH_3I$. Additionally, the resulting film, in view of XRD analysis and the UV/visible absorption spectrum and the like, could not be considered to be pure organolead perovskite ($CH_3NH_3PbI_3$), and was a mixed material containing large quantities of unreacted raw material.

(Example 1) <Duty Ratio Adjustment Example>

Inside a vacuum chamber for deposition, $PbI_2$ and $CH_3NH_3I$ were installed as targets, and a crystal oscillator film thickness meter (provided near the path of the evaporation flux for measuring the film thickness of the deposition film, the same applies to crystal oscillator film thickness meters hereafter) was installed in order to measure the evaporation rate of the $PbI_2$ and the $CH_3NH_3I$. A laser deposition apparatus was set up so as to irradiate the $PbI_2$ with a continuous-wave laser beam having a wavelength of 808 nm, and to irradiate the $CH_3NH_3I$, which is a material having a high vapor pressure, with a pulsed laser beam modulated at 10 Hz and having a wavelength of 808 nm.

Figure 2:
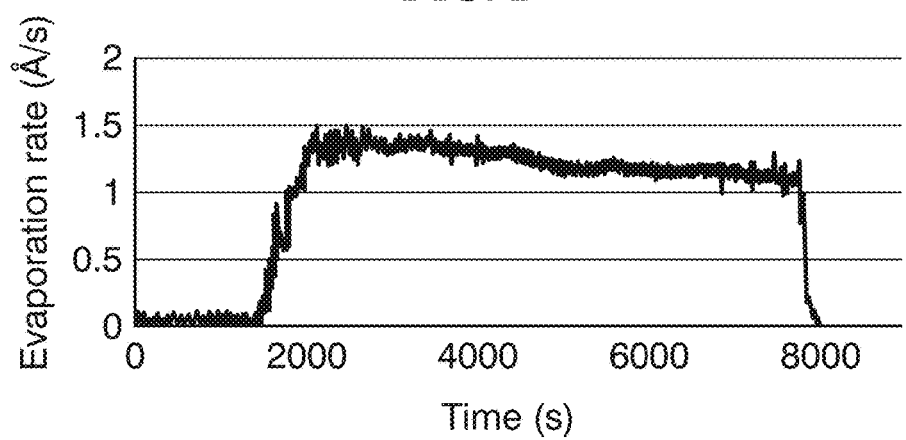
FIG. 2 is a graph showing the time evolution of the total evaporation rate of an inorganic material $PbI_2$ and an organic material $CH_3NH_3I$ when carrying out codeposition by adjusting the duty ratio of the organic material $CH_3NH_3I$-side laser to 26%, in Example 1.

After setting the vacuum level inside the vacuum chamber to $10^{-5}$ Pa, the power of the $PbI_2$-side laser was raised to 1.6 W, and for the $CH_3NH_3I$-side laser, the pulse amplitude was set to 17.9 W and the duty ratio was adjusted to 26%, and codeposition was conducted onto a glass substrate surface. At that time, the total evaporation rate for $PbI_2$ and $CH_3NH_3I$ (the time derivative of the deposition film thickness evolution measured by the crystal oscillator film thickness meter) evolved in a relatively stable manner, without large variations, as shown in the graph in FIG. 2.

After codeposition, the $PbI_2$ target was observed, but absolutely no contamination of the $PbI_2$ target due to the spread of $CH_3NH_3I$ was observed. Additionally, the resulting film, in view of XRD analysis and the UV/visible absorption spectrum and the like, was confirmed to be an organolead perovskite ($CH_3NH_3PbI_3$) with relatively good crystallinity.

(Example 2) <Duty Ratio Adjustment Example 1 Based on Evaporation Rate Measurement>

A laser deposition apparatus was set up by installing $PbI_2$ and $CH_3NH_3I$ as targets inside a vacuum chamber for deposition and also installing a crystal oscillator film thickness meter for measuring the evaporation rate of the $CH_3NH_3I$, so as to irradiate the $CH_3NH_3I$ with a pulsed laser beam modulated at 10 Hz and having a wavelength of 808 nm, while not laser-irradiating the $PbI_2$.

Figure 3:
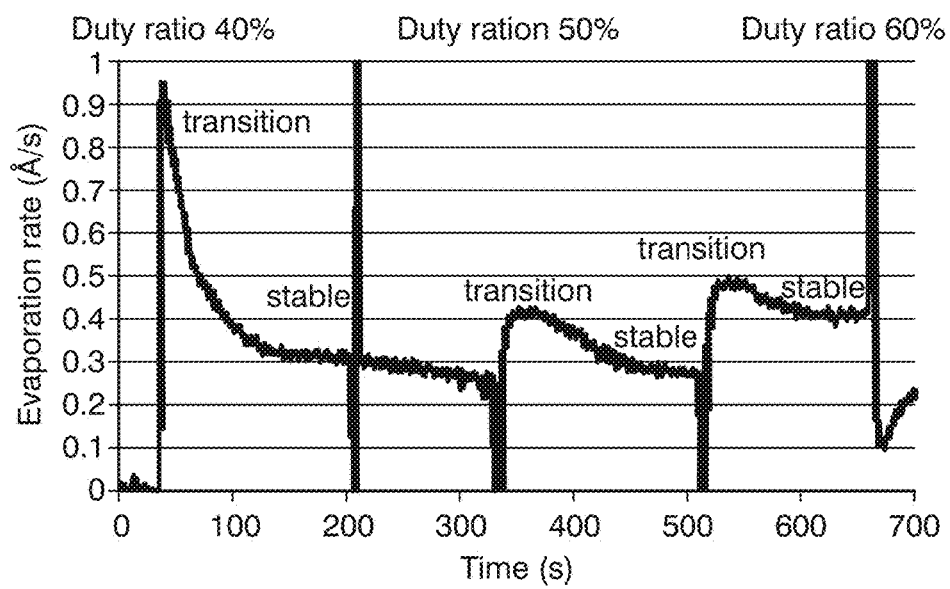
FIG. 3 is a graph showing the time evolution of the evaporation rate of an organic material $CH_3NH_3I$ when adjusting the duty ratio of the organic material $CH_3NH_3I$-side laser in units of 10%, based on observations of the evaporation rate of the organic material, in Example 2.

After setting the vacuum level inside the vacuum chamber to $10^{-5}$ Pa, deposition was conducted onto the glass substrate surface after setting the $CH_3NH_3I$-side laser so as to have a pulse amplitude of 17.9 W and adjusting the duty ratio to 40%, 50% and 60%. The evolution of the evaporation rate of $CH_3NH_3I$ in that case is shown in FIG. 3. The evaporation rate of $CH_3NH_3I$ was seen to vary with the adjustments due to having a large adjustment width of 10% for the duty ratio, but it was found that the evaporation rate can be adjusted within a predetermined range. Additionally, narrowing the duty ratio adjustment width can be expected to improve the adjustability and the controllability of the evaporation rate.

After deposition, the $PbI_2$ target was observed, but absolutely no contamination of the $PbI_2$ target due to the spread of $CH_3NH_3I$ was observed.

(Example 3) <Duty Ratio Adjustment Example 2 Based on Evaporation Rate Measurement>

A laser deposition apparatus was set up by installing $PbI_2$ and $CH_3NH_3I$ as targets and also installing a crystal oscillator film thickness meter for measuring the evaporation rate of the $PbI_2$ and the $CH_3NH_3I$ inside a vacuum chamber for deposition, so as to irradiate the $PbI_2$ with a continuous-wave laser beam having a wavelength of 808 nm, and to irradiate the $CH_3NH_3I$, which is a material having a high vapor pressure, with a pulsed laser beam modulated at 10 Hz and having a wavelength of 808 nm, while observing the PbI$_2$ and CH$_3$NH$_3$I evaporation rates and the vacuum level inside the vacuum chamber.

After setting the vacuum level inside the vacuum chamber to 10$^{-5}$ Pa, the amplitudes of the high-vapor-pressure CH$_3$NH$_3$I-side laser pulses were gradually raised until the evaporation rate of the CH$_3$NH$_3$I became observable. Upon observing the evaporation rate of CH$_3$NH$_3$I, the duty ratio of the laser was gradually raised to set the evaporation rate to a target value of 0.5 Å/s. Next, the power of the PbI$_2$-side laser was raised, the PbI$_2$ was evaporated, the evaporation rate (the total evaporation rate for PbI$_2$ and CH$_3$NH$_3$I), while being observed with the crystal oscillator film thickness meter, was raised to the target value of 1.0 Å/s for codeposition. The CH$_3$NH$_3$I-side laser was set so as to have a pulse amplitude of 17.9 W and the duty ratio was adjusted to 36%. Thereafter, the PbI$_2$-side laser power was raised to 0.7 W and codeposition was started. In order to maintain the evaporation rate, the duty ratio of the CH$_3$NH$_3$I-side laser pulses was adjusted between 36% and 32% while observing the film thickness meter. During codeposition, the film thickness meter was observed until the deposited film thickness reached a target film thickness (100 nm), and the evaporation rate (1.0 Å/s) for codeposition was maintained by adjusting the duty ratio while estimating the evaporation rate of CH$_3$NH$_3$I.

Figure 4:
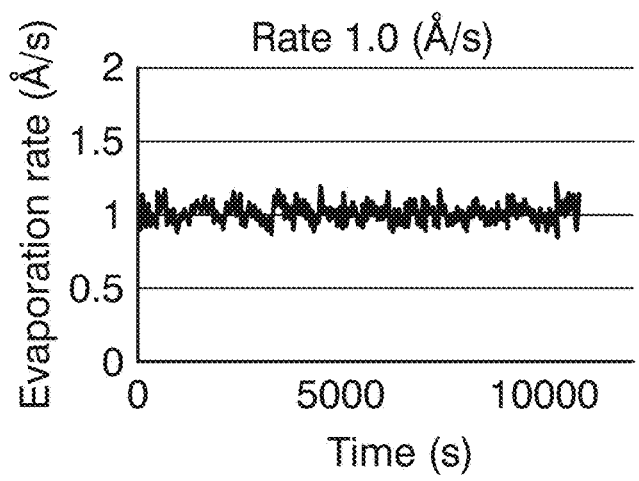
FIG. 4 is a graph showing the time evolution of the total evaporation rate of an inorganic material $PbI_2$ and an organic material $CH_3NH_3I$ when adjusting the duty ratio of the organic material $CH_3NH_3I$-side laser within the range of 36% to 32%, based on estimates of the evaporation rate of the organic material $CH_3NH_3I$, in Example 3.
Figure 5:
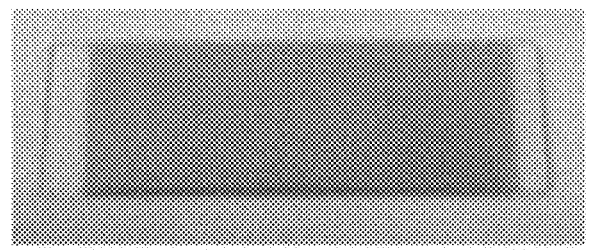
FIG. 5 is a photograph of a thin film formed by Example 3.

FIG. 4 shows a time evolution graph of the evaporation rate (total evaporation rate for PbI$_2$ and CH$_3$NH$_3$I) for codeposition, and FIG. 5 shows a photograph of the completed thin film. The evaporation rate for codeposition was held within the range of 1.0±0.1 Å/s from start to finish. The resulting films, in view of XRD analysis and the UV/visible absorption spectrum and the like, were confirmed to be organolead perovskites (CH$_3$NH$_3$PbI$_3$) with relatively good crystallinity. Additionally, absolutely no contamination of the PbI$_2$ target due to the spread of CH$_3$NH$_3$I was observed.

(Example 4) <Duty Ratio Adjustment Example Based on Vacuum Level Measurement>

Using a laser deposition apparatus that was set up in the same manner as Example 3, after setting the vacuum level inside the vacuum chamber to 10$^{-5}$ Pa, the power of the PbI$_2$-side laser was raised, the PbI$_2$ was evaporated, and the PbI$_2$ evaporation rate, while being observed with the crystal oscillator film thickness meter, was raised to a target value (0.3 Å/s). Meanwhile, as for the laser for evaporating CH$_3$NH$_3$I, which has a high vapor pressure, the amplitudes of the laser pulses were gradually raised while observing the vacuum level of the vacuum chamber, and the vacuum level was made to approach a target value (1.0×10$^{-3}$ Pa, 5.0×10$^{-3}$ Pa or 8.0×10$^{-3}$ Pa). When the vacuum level exceeded the target value, the duty ratio of the laser was adjusted so as to set the vacuum level to the target value, by means of an operation such as lowering the duty ratio of the laser used for evaporating CH$_3$NH$_3$I. Next, the PbI$_2$-side laser power was raised to 0.5 W, after which the CH$_3$NH$_3$I-side laser pulse amplitude was set to 17.9 W and the duty ratio was adjusted to 41%, and codeposition was started. During codeposition, the duty ratio was adjusted within the range of 41% to 39%, while observing the vacuum meter, so as to keep the vacuum level to within a range of 90%/o to 110% of the target value, until the deposition film thickness reached a target film thickness (100 nm). As a result, the total evaporation rate of the inorganic material PbI$_2$ and the organic material CH$_3$NH$_3$I during codeposition was maintained at approximately 0.6 Å/s.

Figure 6:
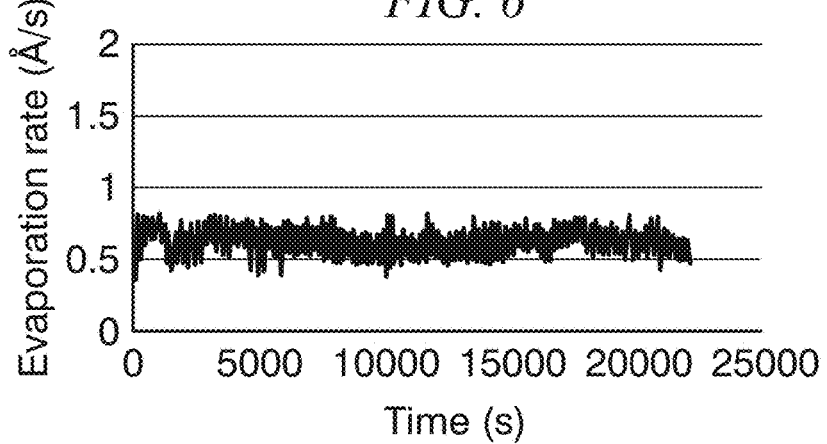
FIG. 6 is a graph showing the time evolution of the total evaporation rate of an inorganic material $PbI_2$ and an organic material $CH_3NH_3I$ when adjusting the duty ratio of the organic material $CH_3NH_3I$-side laser within the range of 41% to 39%, so as to keep the vacuum level in the vacuum chamber constant, in Example 4.
Figure 7:
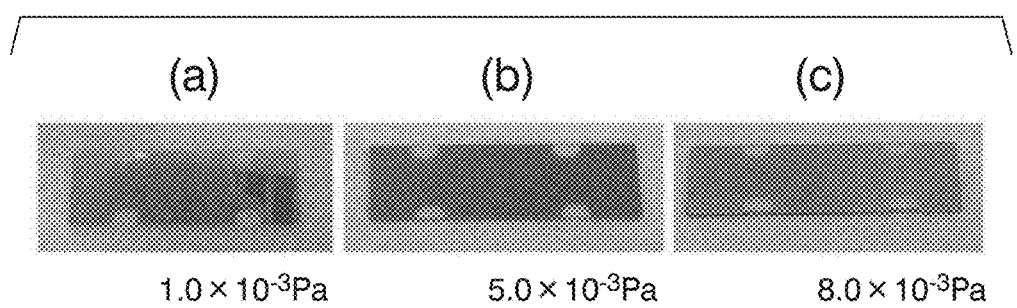
FIG. 7 is a photograph of a thin film formed by Example 4, wherein (a), (b) and (c) used target vacuum levels of respectively $1.0 \times 10^{-3}$ Pa, $5.0 \times 10^{-3}$ Pa and $8.0 \times 10^{-3}$ Pa.

The time evolution of the evaporation rate when the target value of the vacuum level was 1.0×10$^{-3}$ Pa is shown in FIG. 6. Additionally, photographs of the films obtained when the target values of the vacuum level were respectively 1.0×10$^{-3}$ Pa, 5.0×10$^{-3}$ Pa and 8.0×10$^{-3}$ Pa are shown in FIGS. 7(a), (b) and (c). The resulting films, in view of XRD analysis and the UV/visible absorption spectrum and the like, were all confirmed to be organolead perovskites (CH$_3$NH$_3$PbI$_3$) with relatively good crystallinity (in particular, the thin film obtained when the target value was 5.0×10$^{-3}$ Pa had good film quality). Additionally, absolutely no contamination of the PbI$_2$ target due to the spread of CH$_3$NH$_3$I was observed.

The formation of an organolead perovskite film is possible by either a method wherein the duty ratio is adjusted based on the measured evaporation rate as in Example 3, or by a method wherein the duty ratio is adjusted based on the measured vacuum level in the vacuum chamber as in Example 4, but the method wherein the duty ratio is adjusted based on the measured vacuum level in the vacuum chamber provided a perovskite film of higher uniformity and provided higher photoelectric conversion performance.

INDUSTRIAL APPLICABILITY

According to the laser deposition method and the laser deposition apparatus of the present invention, it is possible to effectively and stably form deposition films of various organic materials, while preventing problems such as contamination due to vaporization of the organic material or the film formation rate becoming uncontrollable. Therefore, the invention can be applied not only to the deposition of thin films of just organic materials, but also to the codeposition of various types of organic-inorganic composites, such as organic-inorganic composite perovskites for use in solar cells, EL elements, or the like.

The invention claimed is:

1. A production method for an organic-inorganic composite perovskite film by film formation of the organic-inorganic composite perovskite on a substrate, comprising:
    irradiating an organic material with a laser beam to evaporate the organic material and irradiating an inorganic material with a laser beam and thereby evaporating the inorganic material, and codepositing the organic material and the inorganic material with the substrate and thereby film forming the organic-inorganic composite perovskite on the substrate; wherein
    the organic material is a halide of an organic cation and the organic material has molecular weight of about 200 or less;
    the inorganic material is MX$_2$, where M is a divalent metal ion and X is at least one halogen selected from the group consisting of F, Cl, Br and I;
    the laser beam irradiated to the organic material is a pulsed laser beam with laser pulses having adjustable pulse widths and amplitudes, and a duty ratio of the pulsed laser beam changes during the codeposition; and
    the laser beam irradiated to the inorganic material is either a continuous-wave laser beam having an adjustable power or a pulsed laser beam having an adjustable duty ratio.

2. The production method for an organic-inorganic composite perovskite film according to claim 1, wherein the organic-inorganic composite perovskite is represented by formula (1) or formula (2):

$$AMX_3 \qquad (1)$$

$$B_2MX_4 \qquad (2)$$

where A and B represent organic cations, M represents a divalent metal ion, and X represents a halogen.

3. The production method for an organic-inorganic composite perovskite film according to claim 2, wherein A is $CH_3NH_3^+$;

B is $R^1NH_3^+$, where $R^1$ has two or more carbon atoms and is one selected from the group consisting of an alkyl group, an alkenyl group, an aralkyl group, and an aryl group; and M is any one selected from the group consisting of Pb, Sn and Ge.

4. The production method for an organic-inorganic composite perovskite film according to claim 1, wherein the substrate, the organic material, and the inorganic material are held inside a vacuum chamber; and during codepositing the organic material and the inorganic material with the substrate, the codeposition is carried out under a vacuum level of the order of $10^{-3}$ Pa.

5. The production method for an organic-inorganic composite perovskite film according to claim 1, wherein the laser beam irradiated to the organic material is a pulsed laser beam having an adjustable duty ratio; and the duty ratio of the laser beam irradiated to the organic material is adjusted based on an evaporation rate of the organic material.

6. The production method for an organic-inorganic composite perovskite film according to claim 1, wherein the substrate, the organic material, and the inorganic material are held inside a vacuum chamber;

the laser beam irradiated to the organic material is a pulsed laser beam having an adjustable duty ratio; and the duty ratio of the laser beam irradiated to the organic material is adjusted based on a vapor pressure inside the vacuum chamber.

* * * * *